United States Patent [19]

Fusegawa et al.

[11] Patent Number: 5,834,322
[45] Date of Patent: Nov. 10, 1998

[54] HEAT TREATMENT OF SI SINGLE CRYSTAL

[75] Inventors: Izumi Fusegawa; Hirotoshi Yamagishi; Nobuyoshi Fujimaki; Yukio Karasawa, all of Gunma-ken, Japan

[73] Assignee: Shin-Etsu Handotai Co., Ltd., Tokyo, Japan

[21] Appl. No.: 916,291

[22] Filed: Aug. 22, 1997

Related U.S. Application Data

[63] Continuation of Ser. No. 445,029, May 19, 1995, which is a continuation of Ser. No. 108,285, Aug. 19, 1993, which is a continuation of Ser. No. 850,915, Mar. 12, 1992.

[30] Foreign Application Priority Data

Mar. 15, 1991 [JP] Japan .................................. 3-076876

[51] Int. Cl.$^6$ .................................................. H01L 21/322
[52] U.S. Cl. .................................. 438/12; 438/14; 438/795
[58] Field of Search ................................... 438/795, 799, 438/5, 12, 14

[56] References Cited

U.S. PATENT DOCUMENTS

| | | | |
|---|---|---|---|
| 3,997,368 | 12/1976 | Petroff et al. | 148/1.5 |
| 4,193,783 | 3/1980 | Matsushita | 65/31 |
| 4,314,595 | 2/1982 | Yamamoto et al. | 437/10 |
| 4,376,657 | 3/1983 | Nagasawa et al. | 437/10 |
| 4,378,269 | 3/1983 | Matsushita | 156/617 SP |
| 4,548,654 | 10/1985 | Tobin | 148/1.5 |
| 4,622,082 | 11/1986 | Dyson et al. | 437/10 |
| 5,009,926 | 4/1991 | Fukuda | 427/377 |
| 5,087,321 | 2/1992 | Kamio et al. | 156/608 |
| 5,089,238 | 2/1992 | Araki et al. | 422/249 |
| 5,133,160 | 7/1992 | Lambert et al. | 51/317 |
| 5,228,927 | 7/1993 | Kitagawara et al. | 148/33.2 |
| 5,262,338 | 11/1993 | Fusegawa et al. | 437/40 |
| 5,286,658 | 2/1994 | Shirakawa et al. | 437/10 |
| 5,308,789 | 5/1994 | Yoshimura et al. | 437/141 |
| 5,327,007 | 7/1994 | Imura et al. | 257/610 |
| 5,385,115 | 1/1995 | Tomioka et al. | 117/2 |
| 5,386,796 | 2/1995 | Fusegawa et al. | 117/13 |
| 5,534,112 | 7/1996 | Fusegawa | 156/662.1 |
| 5,688,319 | 11/1997 | Fusegawa et al. | 117/13 |

FOREIGN PATENT DOCUMENTS

| | | |
|---|---|---|
| 0390672 | 3/1990 | European Pat. Off. . |
| 57-200293 | 12/1982 | Japan . |
| 2182262 | 5/1987 | United Kingdom . |
| 2080780 | 2/1992 | United Kingdom . |

OTHER PUBLICATIONS

Yamagishi H, 'Recognition of D Defects in S, Single Cry. by . . . on Gate Oxide Integrity', Semiconductor Sci Tech., 7 (1992) A135–A140, Jan. 1992.

Wolf, Stanley, "Silicon Processing for VLSI Era" vol. 1, p. 53.

Wolf et al., "Silicon Processing for the VLSI Era vol. 1 : Process Technology", Lattice Press, 1986, p. 53.

Journal of the Electrochemical Society, vol. 119, No. 2, Feb. 1972, pp. 255–265, "Effects of Grown–In and Process Induced Defects in Single Crystal Silicon", D. Pomerantz.

IBM Technical Disclosure Bulletin, vol. 19, No. 4, Sep. 1976, p. 1295, "Producing Silicon Semiconductor Wafer", E. Biedermann.

Electronics, vol. 59, No. 10, Sep. 1982, pp. 545–547, "Czochralski Silicon Crystal Growth in the Vertical Magnetic Field", Hoshikawa.

Japanese Journal of Applied Physics, vol. 21, No. 9, Sep. 1982, pp. 545–547, "Czochralski Silicon Crystal Growth in the Vertical Magnetic Field", K. Hoshikawa.

*Primary Examiner*—Charles L. Bowers, Jr.
*Assistant Examiner*—Matthew Whipple
*Attorney, Agent, or Firm*—Ronald R. Snider

[57] ABSTRACT

The method of this invention for heat treatment of a Si single crystal grown by the Czochralski method at a speed of pull of not less than 0.8 mm/min., characterized by heat-treating at a temperature in the range of from 1,150° C. to 1,280° C. a wafer cut out of the Si single crystal thereby producing a Si wafer excellent in oxide film dielectric breakdown voltage characteristic due to elimination of crystal defects. Consequently, this invention ensures production of LSI in a high yield.

3 Claims, 5 Drawing Sheets

HEAT TREATMENT OF SI SINGLE CRYSTAL

This application is a continuation of application Ser. No. 08/445,029, filed May 19, 1995 which is a continuation of application Ser. No. 08/108,285 filed Aug. 19, 1993, which is a continuation of application Ser. No. 07/850,915 filed Mar. 12, 1992.

BACKGROUND OF THE INVENTION

1. Field of the Invention

This invention relates to heat treatment of a Si single crystal. More particularly, this invention relates to heat treatment of a Si single crystal for production of a Si wafer excellent in oxide film dielectric breakdown voltage characteristic.

2. Description of the Prior Art

Increasingly high integration of semiconductor circuits and the attendant miniaturization of their elements have been urging a growing decrease in thickness of insulating oxide films in the gate electrode parts of MOS-LSI. Even these thin insulating oxide films are required to exhibit a high dielectric breakdown voltage during the operation of relevant device elements, suffer only a small leak current, and fulfil their functions with high reliability.

For the production of these device elements, Si single crystals produced by the Czochralski method are used. The Si single crystals of the Czochralski method contain crystal defects owing to the thermal history experienced in highly heated portions during the growth of crystal.

When LSI elements are formed with a wafer from a Si single crystal containing such crystal defects, the insulating oxide films in the elements offer a problem of inferior dielectric breakdown voltage.

For a given Si wafer to allow production of LSI elements in a high yield, it is important that the Si wafer should be free from such defects as to impair the dielectric breakdown voltage characteristic of the oxide film.

These crystal defects are found to be correlated with the speed of growth of a crystal; the density of defects decreases and consequently the dielectric breakdown voltage characteristic of an oxide film improves in accordance as the speed of crystal growth decreases. From the commercial point of view, the Si single crystals produced with due respect to this correction have a problem of poor efficiency on account of a low speed of crystal growth.

This problem will be discussed below on the basis of the knowledge the inventors acquired during their study which led to perfection of this invention. FIG. 4 shows the density of defects in a wafer taken from a Si single crystal produced by the conventional technique in relation to the speed of crystal growth. The determination of the density of defects was carried out by etching a given wafer for 30 minutes in accordance with the selective etching method (the method using an etching solution consisting of 2 g of $K_2Cr_2O_7$, 50 ml of $H_2O$, and 100 ml of HF; Secco D'Arragona, F.: J. Electrochem. Soc., 119: 948, 1972) and then taking count of scale-like patterns formed on the etched surface as observed under an optical microscope. The density of scale-like patterns was 20 counts/cm$^2$ when the speed of crystal growth was as low as 0.4 mm/min. When the speed of crystal growth exceeded 1 mm/min., however, this density was as high as 1,000/cm$^2$.

Wafers of this class were tested for determination of the dielectric breakdown voltage characteristic of oxide film. The determination of the dielectric breakdown voltage characteristic of oxide film was carried out by forming 100 elements in a given Si wafer, selecting out as acceptable products the elements whose oxide films had dielectric breakdown voltages exceeding 8 MV/cm. For testing the oxide film dielectric breakdown voltage characteristic, gate parts measuring 8 mm$^2$ in area and made of polysilicon were used. The formation of an oxide film were carried out at 900° C. for 100 minutes (in an atmosphere of dry oxygen). The oxide films had a thickness of 250 Å.

The actual results of determination are illustrated in terms of relation between the ratio of acceptable products (with sufficiently high oxide film dielectric breakdown voltage) and the density of scale-like patterns. In the case of a Si wafer which registered a high density of scale-like patterns of 1,000 counts/cm$^2$, the ratio of acceptable products because of sufficiently high oxide film dielectric breakdown voltage was about 40%. When the density of scale-like patterns was about 200 counts/cm$^2$, the ratio of acceptable products was 80%. These results indicate that the improvement of the ratio of acceptable products of sufficiently high oxide film dielectric breakdown voltage requires to decrease the density of scale-like patterns appearing during the selective etching, namely to decrease the density of defects.

SUMMARY OF THE INVENTION

This invention, conceived in the urge to overcome the drawbacks of the prior art mentioned above, aims to provide a method which, in a wafer from a Si single crystal, effects elimination of crystal defects possibly contained while the Si single crystal is grown at the lowest costwise acceptable speed.

The heat treatment of this invention of a Si single crystal grown by the Czochralski method at a speed of pull of not less than 0.8 mm/min., characterized by heat-treating at a temperature in the range of from 1,150° C. to 1,280° C. a wafer cut out of the Si single crystal thereby producing a Si wafer excellent in oxide film dielectric breakdown voltage characteristic.

DETAILED DESCRIPTION OF THE PREFERRED EMBODIMENT

In this invention, the heat treatment is given to a wafer which has been cut off a Si single crystal grown grown by the Czochralski method at a speed of pull of not less than 0.8 mm/min. This invention, therefore, has a great significance in allowing production of a Si wafer excellent in oxide film dielectric breakdown voltage characteristic from a Si single crystal grown at the lowest costwise acceptable speed of not less than 0.8 mm/min. by heat-treating the wafer from the single crystal thereby obtaining elimination of crystal defects from the wafer.

Now, this invention will be described below with reference to the accompanying drawings.

Figure 1:
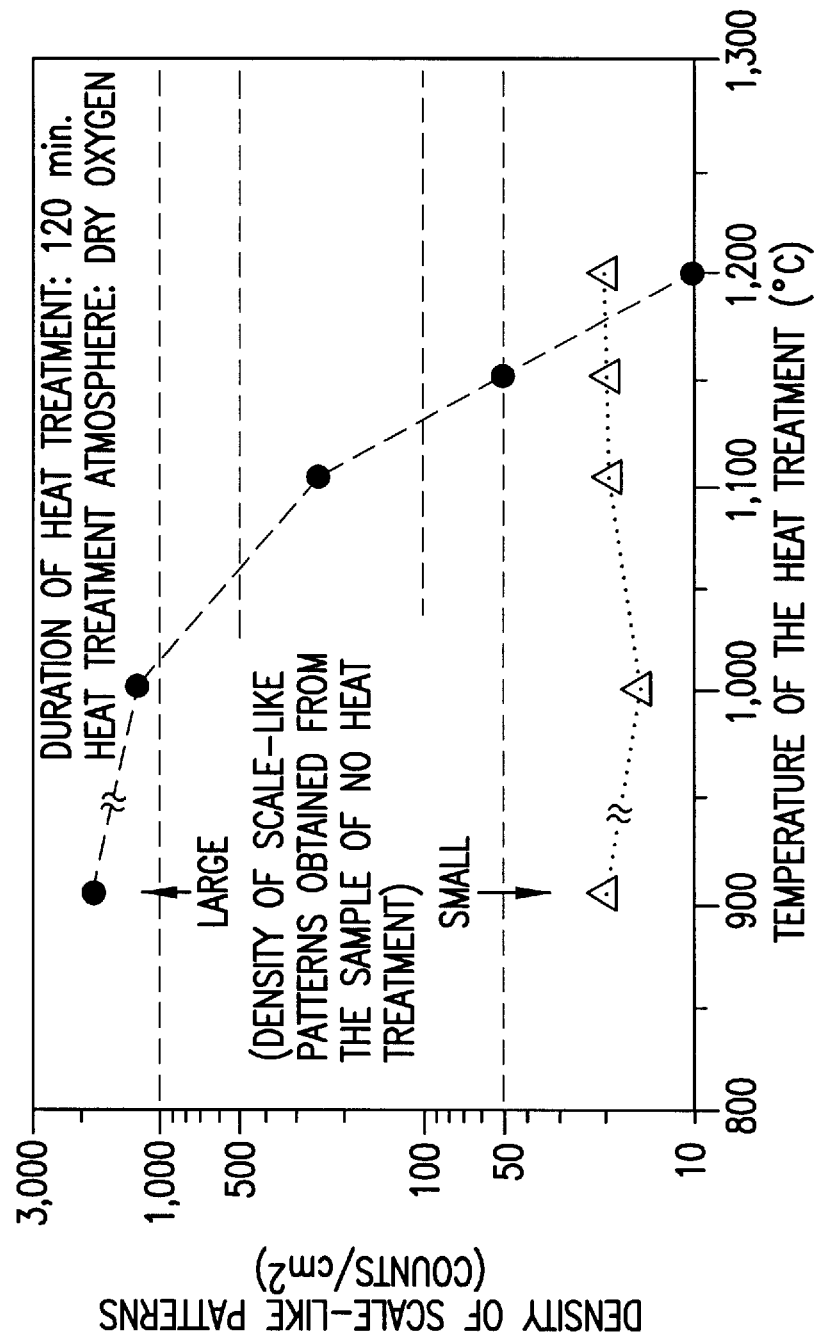
FIG. 1 is a graph showing the effect of the temperature of heat treatment on the density of scale-like patterns.
Figure 2:
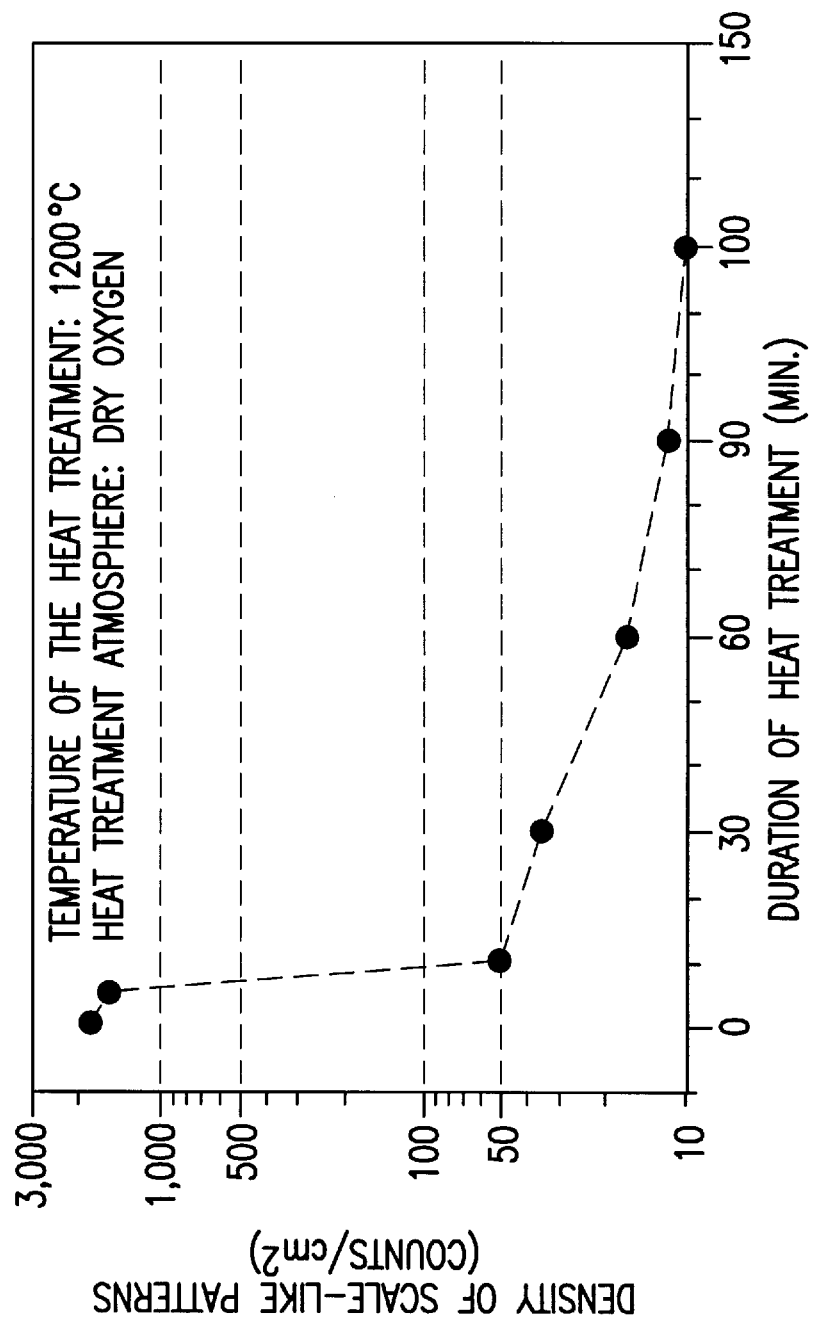
FIG. 2 is a graph showing the effect of the time of heat treatment on the density of scale-like patterns.

FIG. 1 shows the relation between the density of crystal defects (scale-like patterns observable by the selective etching method) and the temperature of heat treatment. It is clearly noted from the diagram that while a Si wafer having a small density of scale-like patterns before the heat treatment has a small density even after the heat treatment, a Si wafer having a large density of scale-like patterns before the heat treatment acquires an effective decrease of the density in consequence of the heat treatment performed at a temperature of not lower than 1,150° C. FIG. 2 shows the relation between the density of scale-like patterns and the time of the heat treatment at a temperature of 1,200° C. From this diagram, it is clearly noted that even a Si wafer having a large density of scale-like patterns before the heat treatment acquires an effective decrease in the density of scale-like patterns in consequence of the heat treatment performed for a period of not less than 10 minutes.

In the light of the data described above, the temperature of the heat treatment must exceed 1,150° C. Further since the upper limit of the working temperature of a quartz tube to be used for the heat treatment is 1,280° C. and since the degree of contamination increases in proportion as the temperature increases, the temperature of the heat treatment contemplated by this invention is limited to the range of from 1,150° C. to 1,280° C., preferably from 1,150° C. to 1,200° C. The time of the heat treatmentis desired to be not less than 10 minutes, preferably to be in the range of from 10 to 120 minutes. No sufficient elimination of crystal defects is obtained if the time of the heat treatment is less than 10 minutes. The heat treatment tends to impair the economy thereof if this time exceeds 120 minutes.

<EXAMPLE>

Now, this invention will be described below with reference to a working example.

Example 1

Several silicon semiconductor single crystal bars 130 mm in diameter were grown by the Czochralski method with the speed of pull varied between 0.4 mm/min. and 1.6 mm/min. These single crystal bars were invariably pulled in the orientation of <100>. Wafers of a prescribed thickness were cut out of each of the single crystal bar with a diamond saw. The wafers were finished as polished wafers by having their surfaces chemically polished.

The Si wafers thus obtained were subjected to the heat treatment and then etched for 30 minutes by the selective etching method to determine the relation between the temperature of the heat treatment and the density of scale-like patterns formed on the etched surfaces. The results are shown in FIG. 1. It is clearly noted from the diagram that even a wafer having a large density of scale-like patterns (abounding in crystal defects) were deprived of the scale-like patterns by the heat treatment at a temperature exceeding 1,150° C., indicating that the heat treatment brought about elimination of crystal defects.

Then, a wafer sample having a density of scale-like patterns of 2,000/cm$^2$ was heat-treated at a temperature of 1,200° C., to determine the relation between the time of the heat treatment and the density of scale-like patterns. The results are shown in FIG. 2. It is clearly noted from the diagram that the heat treatment at 1,200° C. produced a notable decrease of crystal defects when the time of this heat treatment exceeded 10 minutes.

Figure 3:
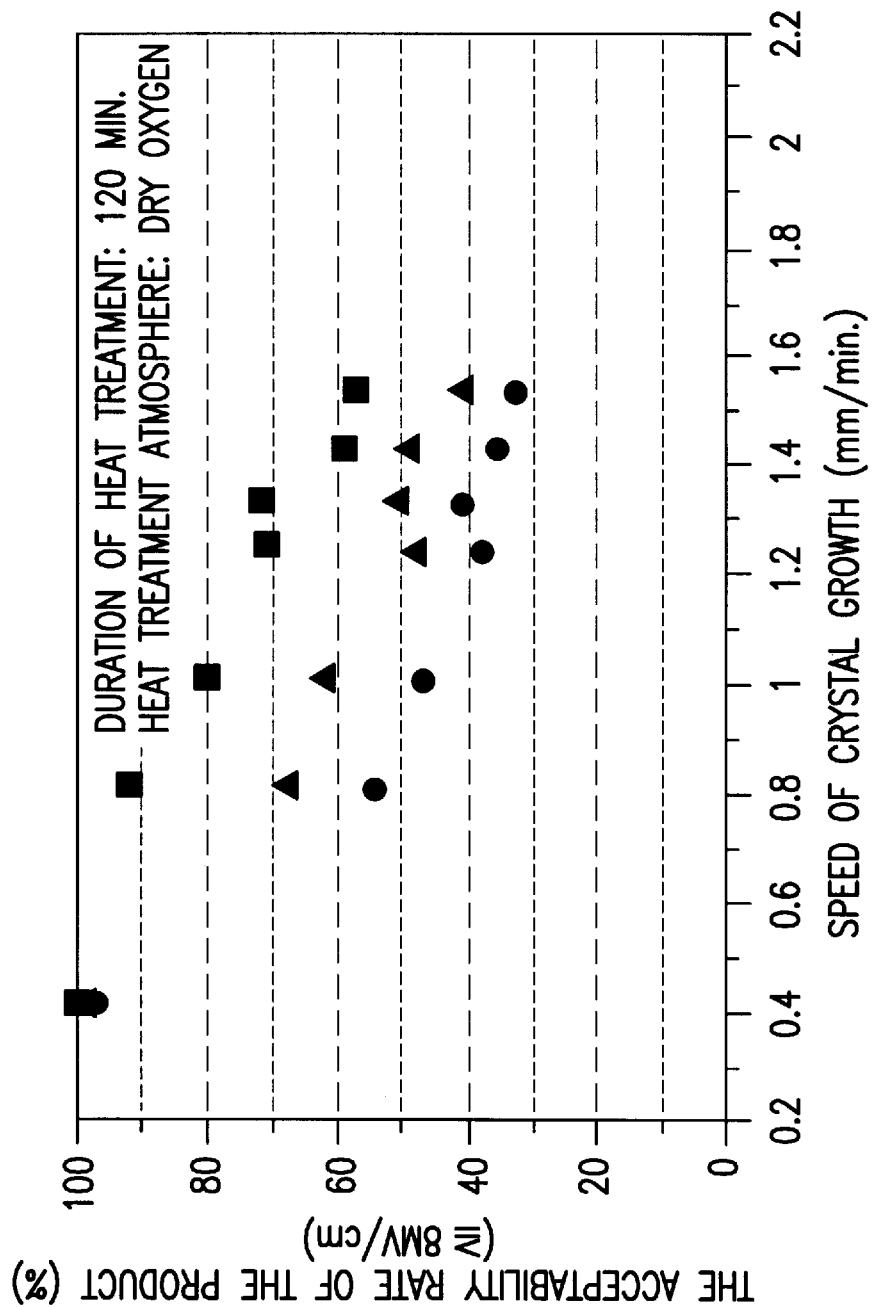
FIG. 3 is a graph showing the effect of preheat treatment on the ratio of acceptable products of sufficiently high oxide film dielectric breakdown voltage.
Figure 4:
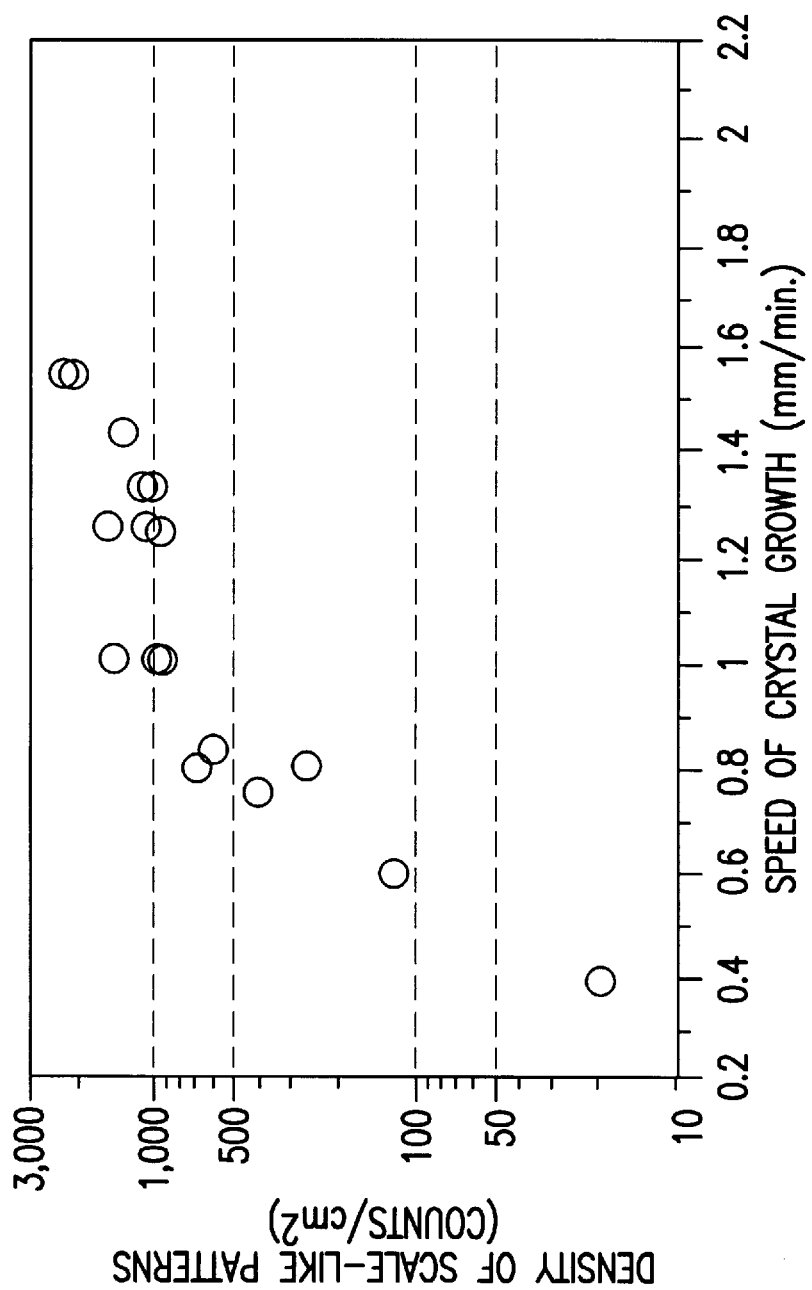
FIG. 4 is a graph showing the relation between the density of scale-like patterns and the speed of crystal growth.
Figure 5:
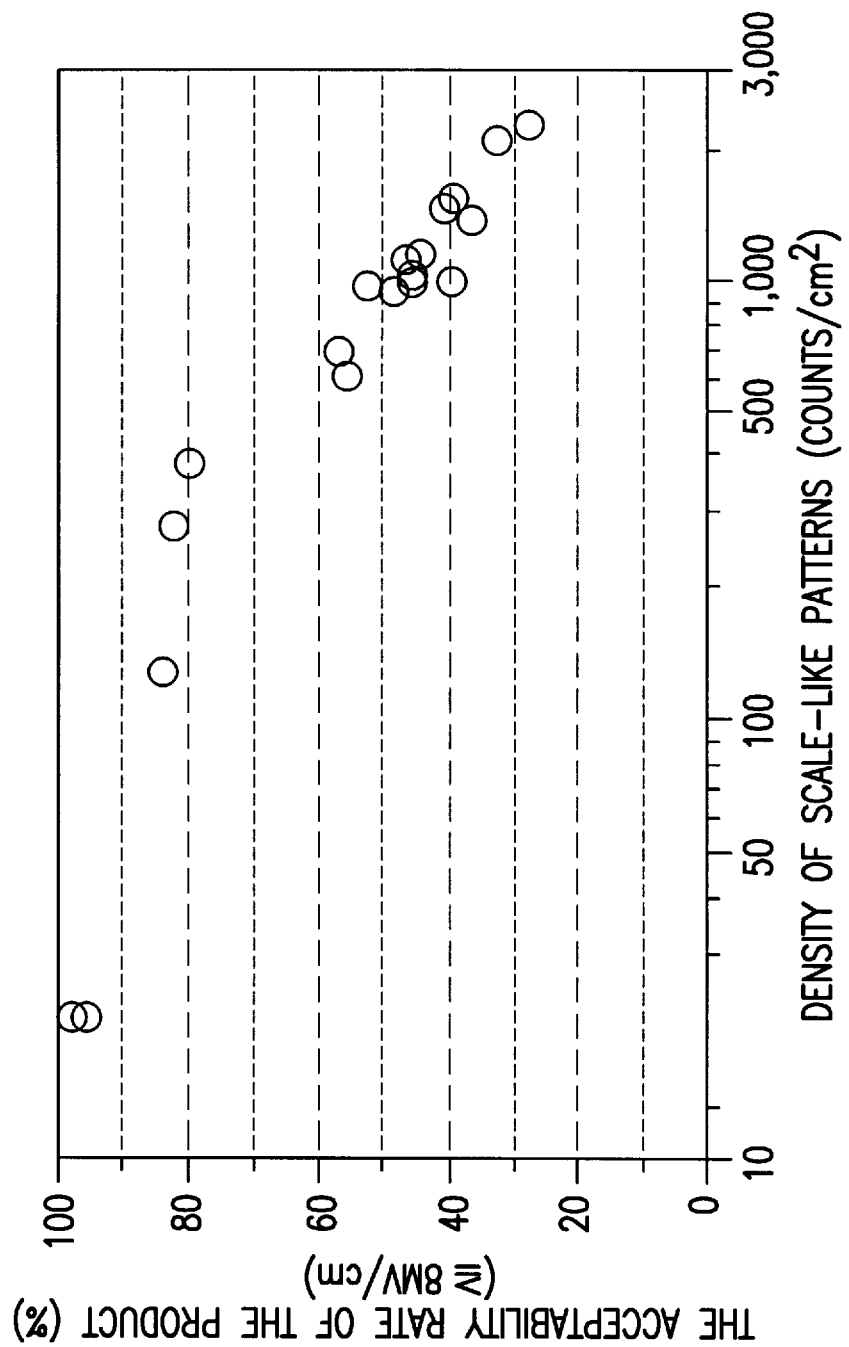
FIG. 5 is a graph showing the relation between the density of scale-like patterns and the ratio of acceptable products of sufficiently high oxide film dielectric breakdown voltage.

Subsequently, the heat-treated Si wafer was tested to determine the effect of the heat treatment upon the improvement of oxide film dielectric breakdown voltage characteristic in terms of the relation between the speed of crystal growth and the ratio of conforming products of satisfactorily high oxide film dielectric breakdown voltage. The determination of the oxide film dielectric breakdown voltage characteristic was carried out by forming 100 elements in a given Si wafer and selecting as conforming products the elements whose oxide films exhibited dielectric breakdown voltage exceeding 8 MV/cm. For testing the oxide film dielectric breakdown voltage characteristic, gate parts measuring 8 mm$^2$ in area and made of polysilicon were used. The formation of an oxide film were carried out at 400° C. for 100 minutes (in an atmosphere of dry oxygen). The oxide films had a thickness of 250 Å. The results are shown in FIG. 3. In the diagram, the circular mark (○) demotes a sample not undergone the heat treatment, the triangle mark (Δ) a sample preheat-treated at 1,100° C. for two hours (in an atmosphere of dry oxygen), and the square mark (□) a sample preheat-treated at 1,200° C. for two hours (in an atmosphere of dry oxygen). For a fixed speed of crystal growth about of 1.2 mm/min., the ratio of conforming products with sufficiently high oxide film dielectric breakdown voltage from the samples given no heat treatment was about 40%. In the case of the samples subjected to the preheat treatment at 1,100° C., the ratio of acceptable products was 50%, indicating an improvement of about 10% in the characteristic. In the case of the samples subjected to the preheat treatment at 1,200° C., the rate of acceptable products was 70%, indicating an improvement of about 200% relative to the ratio obtained of the samples given no preheat treatment. The samples given no preheat treatment and excelling in dielectric breakdown voltage characteristic gave a high rate of acceptable products of sufficiently high oxide film dielectric breakdown voltage without reference to the heat treatment, indicating that the Si wafers of this nature retained highly satisfactory oxide film dielectric breakdown voltage characteristic even after a preheat treatment at a high temperature. It is now evident that in Si wafers produced at speeds of crystal growth falling in a wide range, the heat treatment of this invention adapted to the qualities of the Si wafers is effective in improving and uniformization of the oxide film dielectric breakdown voltage characteristics of the Si wafers.

It is clear from the description given above that even from Si single crystals grown at a commercially efficient high speed of crystal growth, the heat treatment of this invention applied as properly adapted allows production of Si wafers excelling in oxide film dielectric breakdown voltage characteristic due to elimination of crystal defects. Consequently, this invention ensures production of LSI in a high yield.

What is claimed is:

1. A method for heat treatment of a wafer cut out of a Si single crystal bar grown by the Czochralski method at a speed of pull exceeding 0.8 mm/min and not higher than 1.6 mm/min. for the purpose of obtaining a Si single crystal wafer with an improved oxide film dielectric breakdown voltage acceptance rate, comprising the step of:

determining a first correlation between the acceptability rate of a product and the density of scale-like patterns obtained by selective etching of wafers;

determining a second correlation between said density of scale like patterns and duration of heat treatment of wafers;

heating said Si single crystal wafer at a temperature in the range of 1150° C. to 1280° C. and;

maintaining said temperature of the single crystal wafer within said temperature range for a time period which is selected on the basis of said first and second correlations which is required to improve the acceptability rate of the product.

2. A method in accordance with claim 1, wherein the time period for heat treatment required for said improved acceptability rate is determined by counting the scale like patterns to determine the density of said scale like patterns of the wafer.

3. A method for determining the time period for heat treatment of silicon wafers for the purpose of obtaining said silicon wafers with improved oxide film dielectric breakdown voltage acceptance rates, comprising the steps of:

obtaining a correlation of dielectric breakdown voltage acceptance rate and the time period for heat treatment;

revealing scale-like patterns by selective etching;

counting generated scale-like patterns by means of an optical microscope;

correlating density of scale like patterns and duration of heat treatment; and obtaining the time period for heat treatment by reference to said correlation between density of scale like patterns and duration of heat treatment.

* * * * *